US008829969B2

(12) United States Patent
Hwang et al.

(10) Patent No.: US 8,829,969 B2
(45) Date of Patent: Sep. 9, 2014

(54) LEVEL-DOWN SHIFTER

(75) Inventors: Moon-Sang Hwang, Yongin (KR);
Won-Jun Choe, Yongin (KR);
Hyun-Chang Kim, Seoul (KR);
Deog-Kyoon Jeong, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/357,654

(22) Filed: Jan. 25, 2012

(65) Prior Publication Data
US 2012/0206185 A1  Aug. 16, 2012

(30) Foreign Application Priority Data

Feb. 14, 2011 (KR) .................. 10-2011-0012852

(51) Int. Cl.
*H03L 5/00* (2006.01)
(52) U.S. Cl.
USPC ................................ 327/333; 326/62; 326/80
(58) Field of Classification Search
USPC .................... 326/62–63, 80–81; 327/306, 333
See application file for complete search history.

(56) References Cited

U.S. PATENT DOCUMENTS 6,344,765 B2 *  2/2002  Taguchi .................. 327/333
7,276,953 B1 * 10/2007  Peng et al. ............. 327/333

FOREIGN PATENT DOCUMENTS

| KR | 1997-0055494 A | 7/1997 |
| KR | 10-2000-0077253 A | 12/2000 |
| KR | 10-2007-0013086 A | 1/2007 |

* cited by examiner

*Primary Examiner* — Dinh Le
(74) *Attorney, Agent, or Firm* — Lee & Morse, P.C.

(57) ABSTRACT

A level-down shifter includes: a first load device between a first voltage and a first node; a second load device between the first voltage and a second node; a first input device between the first node and a third node, receiving a reference voltage signal, and adjusting a first node voltage of the first node based on the reference voltage signal; a second input device between the second node and the third node, receiving an input signal, and adjusting a second node voltage of the second node based on the input signal; and a current source between a second voltage and the third node, receiving the second node voltage of the second node, and adjusting a third node voltage of the third node and a bias current based on the second node voltage of the second node, wherein a level of the input signal is higher than the first voltage.

26 Claims, 11 Drawing Sheets

FIG. 4 (COMPARATIVE EXAMPLE)

FIG. 5
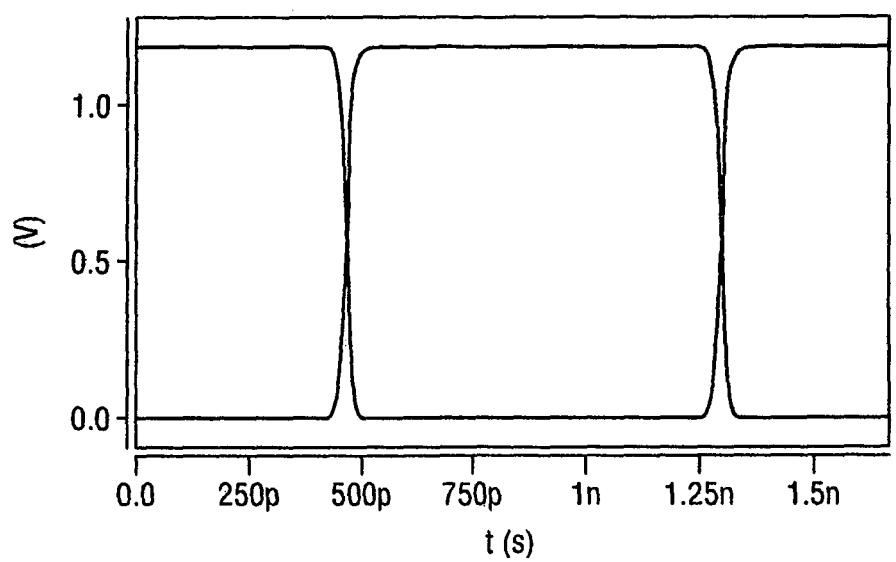
<EXPERIMENTAL EXAMPLE>
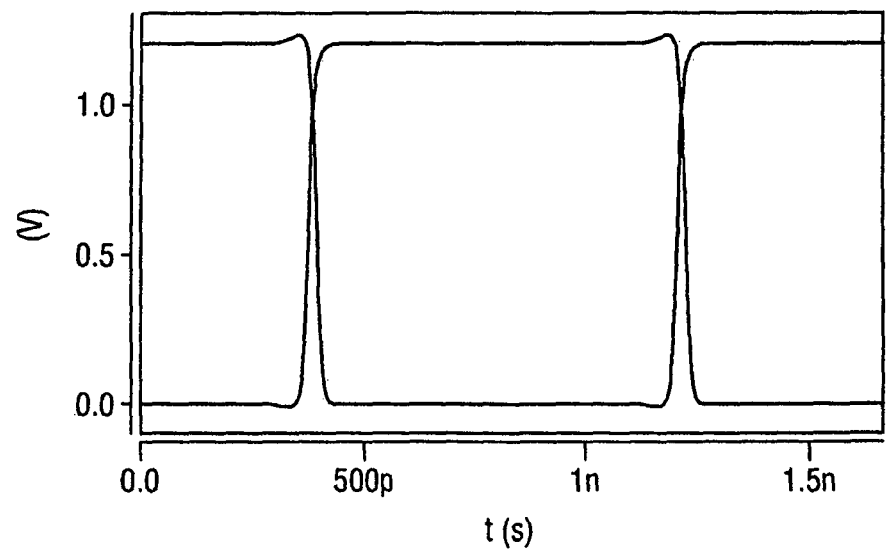
<COMPARATIVE EXAMPLE>

FIG. 6
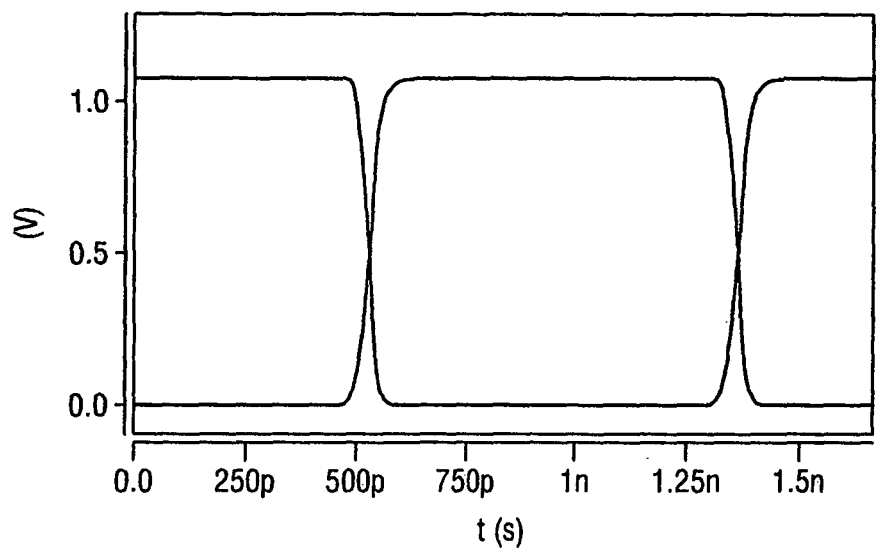
<EXPERIMENTAL EXAMPLE>
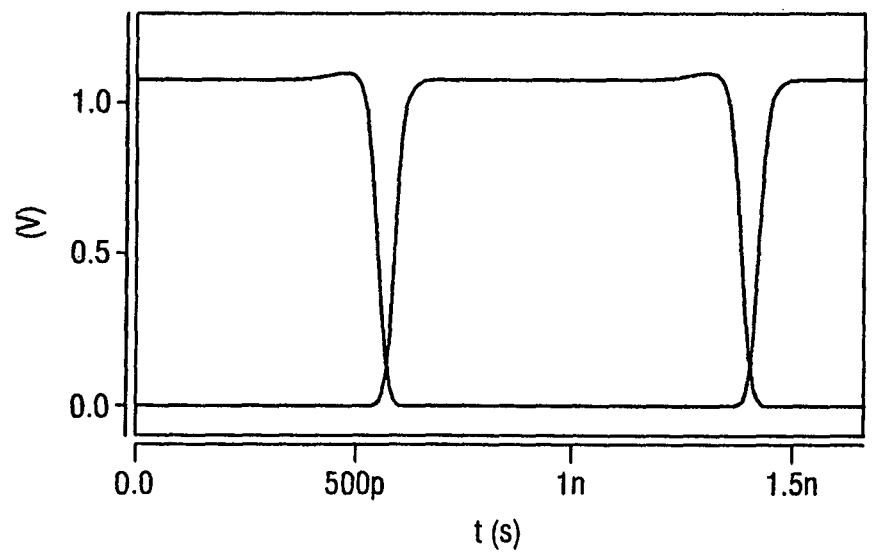
<COMPARATIVE EXAMPLE>

FIG. 7
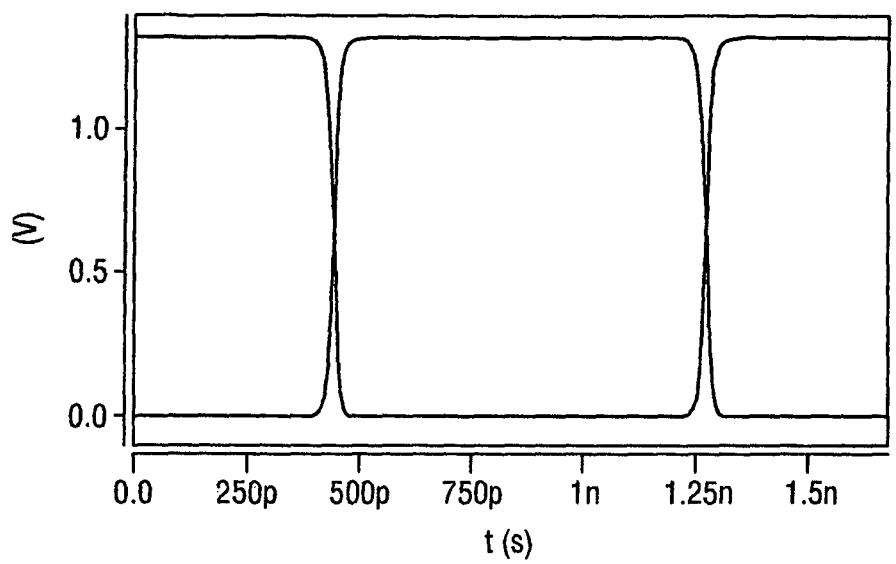
<EXPERIMENTAL EXAMPLE>
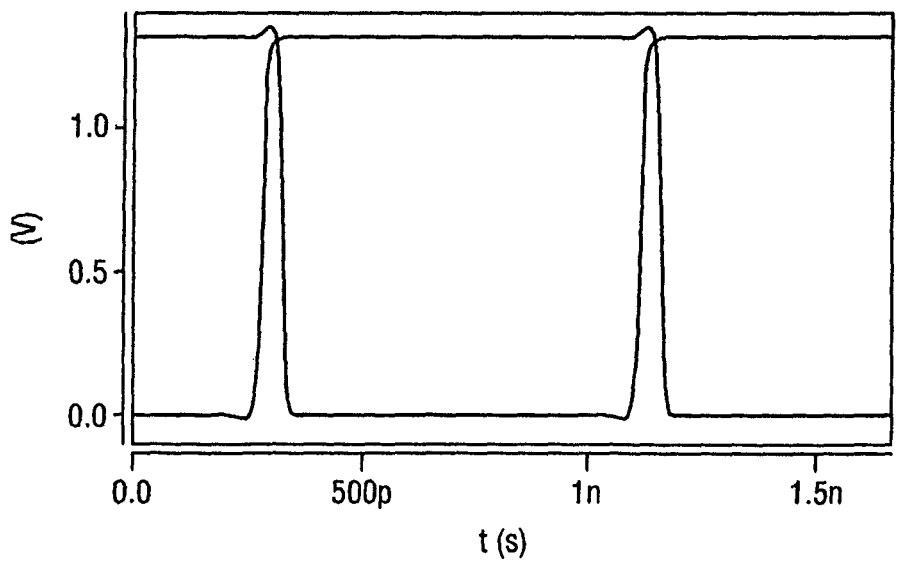
<COMPARATIVE EXAMPLE>

FIG. 8
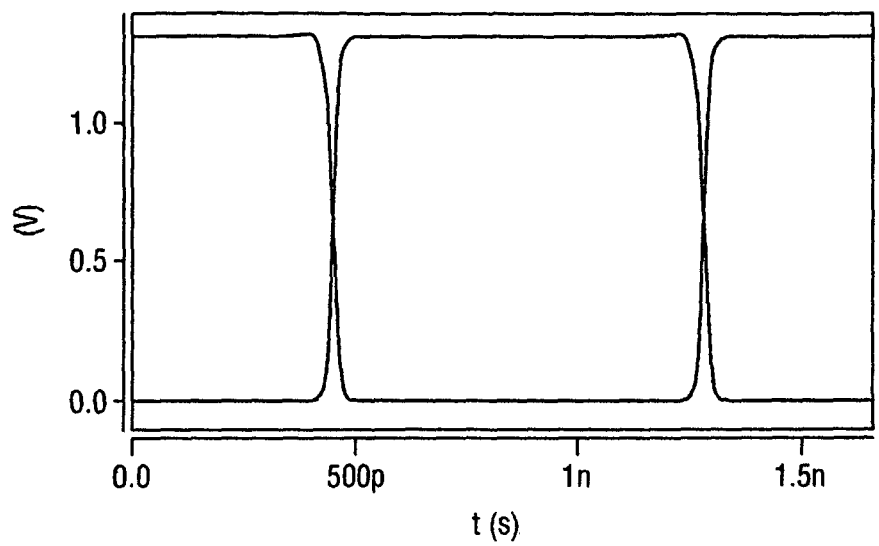
<EXPERIMENTAL EXAMPLE>
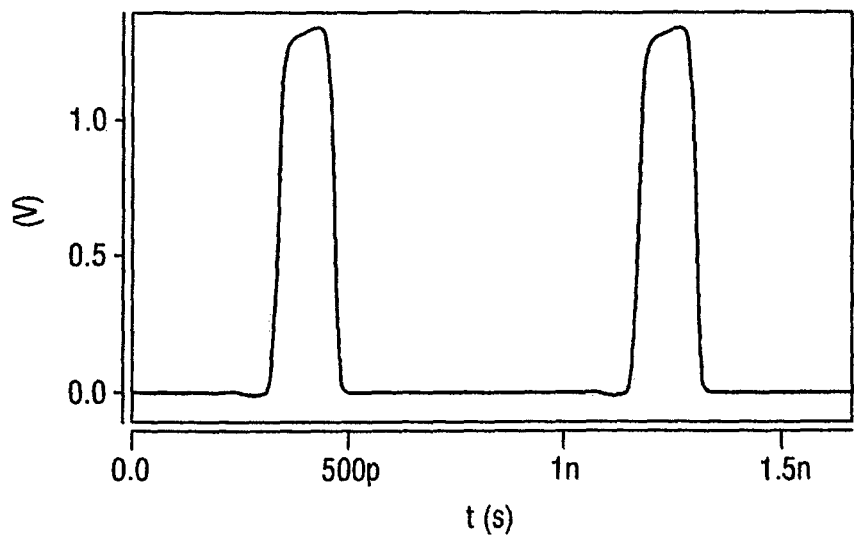
<COMPARATIVE EXAMPLE>

FIG. 9
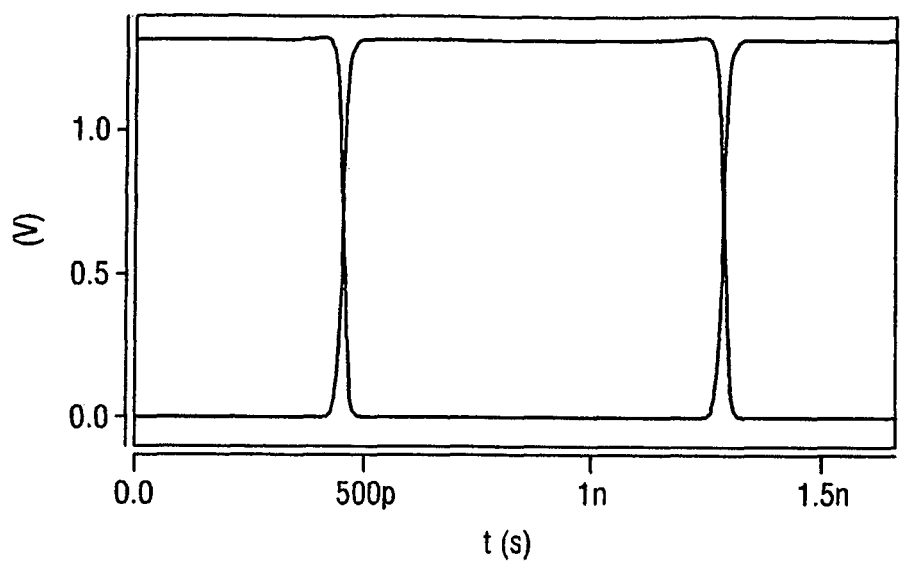
<EXPERIMENTAL EXAMPLE>
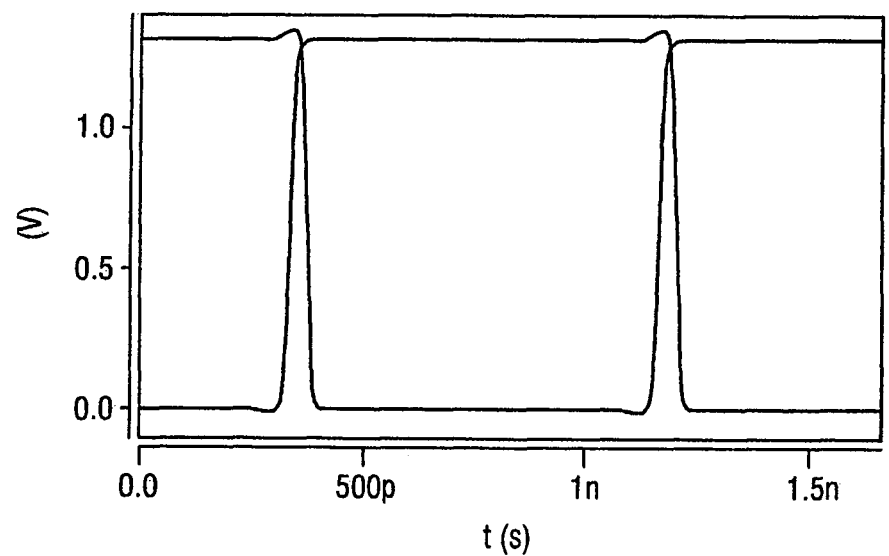
<COMPARATIVE EXAMPLE>

FIG. 10
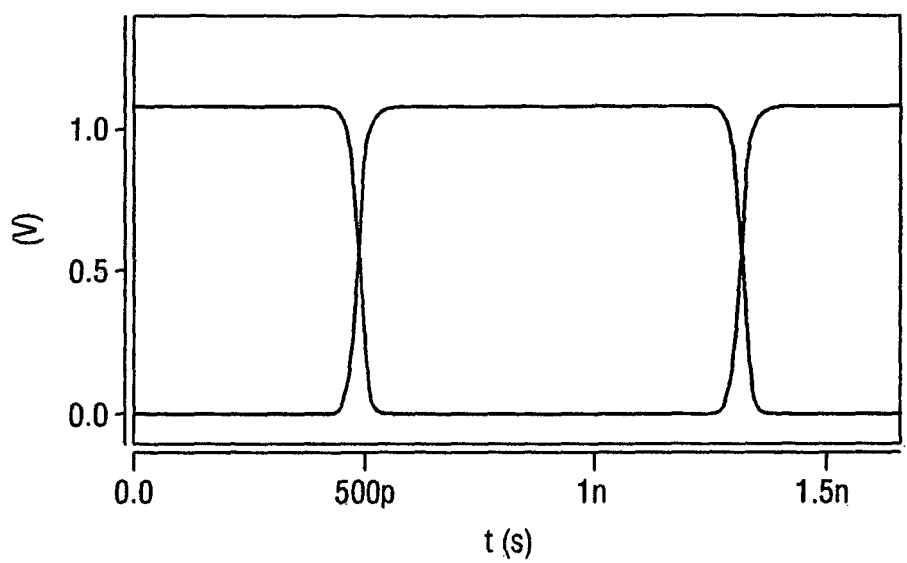
<EXPERIMENTAL EXAMPLE>
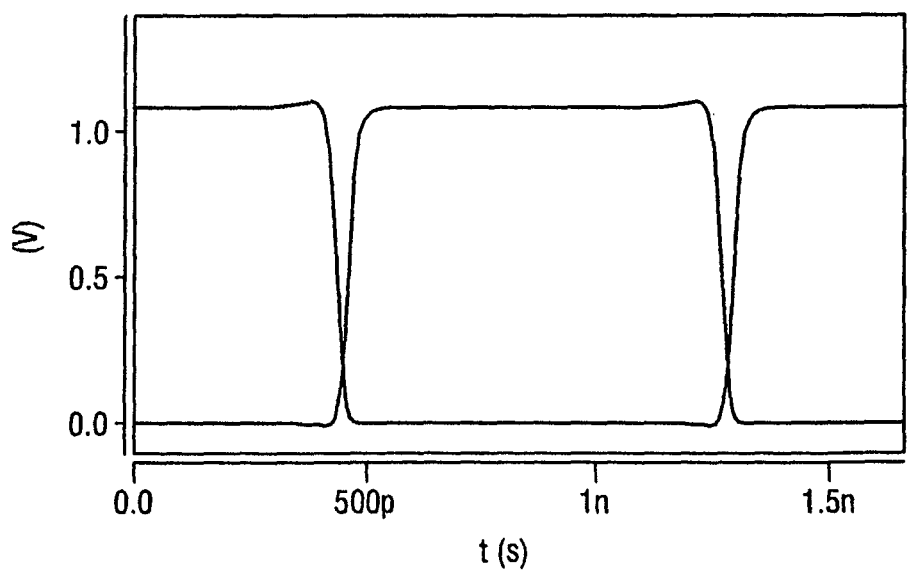
<COMPARATIVE EXAMPLE>

FIG. 11
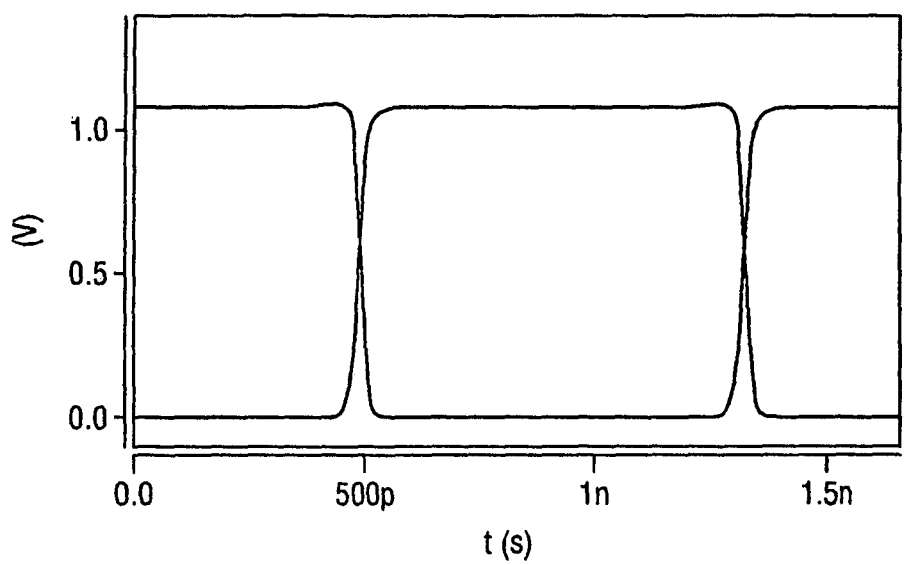
<EXPERIMENTAL EXAMPLE>
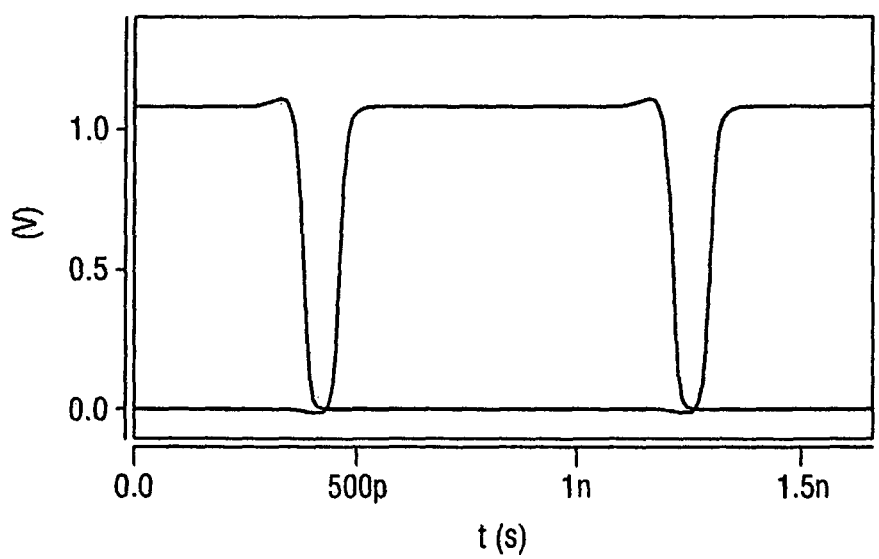
<COMPARATIVE EXAMPLE>

US 8,829,969 B2

LEVEL-DOWN SHIFTER

This application claims priority from Korean Patent Application No. 10-2011-0012852 filed on Feb. 14, 2011 in the Korean Intellectual Property Office, the disclosure of which is incorporated herein by reference in its entirety.

BACKGROUND

1. Field

Embodiments relate to a level-down shifter. More particularly, embodiments relate to a level-down shifter having a self-biased structure.

2. Description of the Related Art

As semiconductor memory devices are required to become more highly integrated and provide higher capacity, their designs are continuously being reduced in order to integrate more semiconductor memory devices in a semiconductor chip. However, as the integration density and capacity of semiconductor memory devices increase, their power consumption also increases. Thus, a lot of effort is being made to reduce power consumption.

SUMMARY

Present embodiments may be directed to a level-down shifter circuit.

According to an embodiment, there may be a level-down shifter including: a first load device connected between a first voltage and a first node; a second load device connected between the first voltage and a second node; a first input device connected between the first node and a third node, receiving a reference voltage signal, and adjusting a first node voltage of the first node based on the reference voltage signal; a second input device connected between the second node and the third node, receiving an input signal, and adjusting a second node voltage of the second node based on the input signal; and a current source connected between a second voltage and the third node, receiving the second node voltage of the second node, and adjusting a third node voltage of the third node and a bias current based on the second node voltage of the second node, wherein a voltage level of the input signal is higher than that of the first voltage.

According to another embodiment, there may be a level-down shifter including: a first p-channel metal oxide semiconductor (PMOS) transistor connected between a first voltage and a first node and having a gate connected to a second node; a second PMOS transistor connected between the first voltage and the second node and having a gate connected to the second node; a first n-channel metal oxide semiconductor (NMOS) transistor connected between the first node and a third node and adjusting a first node voltage of the first node when turned on by a reference voltage signal; a second NMOS transistor connected between the second node and the third node and adjusting a second node voltage of the second node when turned on by an input signal; and a third NMOS transistor connected between the third node and a second voltage, receiving the second node voltage of the second node, and adjusting a third node voltage of the third node and a bias current based on the second node voltage of the second node, wherein a voltage level of the input signal is higher than that of the first voltage.

Gate oxide films of the first and second NMOS transistors may be thicker than gate oxide films of the first and second PMOS transistors and the third NMOS transistor. The gate oxide films of the first and second NMOS transistors may have a thickness of 0.35 μm, and the gate oxide films of the first and second PMOS transistors and the third NMOS transistor may have a thickness of 0.13 p.m.

BRIEF DESCRIPTION OF THE DRAWINGS

The above and other features of present embodiments will become more apparent by describing in detail exemplary embodiments thereof with reference to the attached drawings, in which:

FIG. 5 illustrates the results of simulations performed under a normal condition where normal n-channel metal oxide semiconductor (NMOS) and p-channel metal oxide semiconductor (PMOS) transistors and normal power required in a process are used and where temperature is 25° C.;

FIG. 6 illustrates the results of simulations performed under a low-speed condition where low-speed NMOS transistors, low-speed PMOS transistors and 10% less power than normal are used and where temperature is 100° C.;

FIG. 7 illustrates the results of simulations performed under a high-speed condition where high-speed NMOS transistors, high-speed PMOS transistors and 10% more power than normal are used and where temperature is 0° C.;

FIG. 8 illustrates the results of simulations performed under high-speed/low-speed condition 1 where high-speed NMOS transistors, low-speed PMOS transistors and 10% more power than normal are used and where temperature is 0° C.;

FIG. 9 illustrates the results of simulations performed under low-speed/high-speed condition 1 where low-speed NMOS transistors, high-speed PMOS transistors and 10% more power than normal are used and where temperature is 0° C.;

FIG. 10 illustrates the results of simulations performed under high-speed/low-speed condition 2 where high-speed NMOS transistors, low-speed PMOS transistors and 10% less power than normal are used and where temperature is 100° C.; and FIG. 11 illustrates the results of simulations performed under low-speed/high-speed condition 2 where low-speed NMOS transistors, high-speed PMOS transistors and 10% less power than normal are used and where temperature is 100° C. 26/15.

DETAILED DESCRIPTION

Example embodiments will now be described more fully hereinafter with reference to the accompanying drawings; however, they may be embodied in different forms and should not be construed as limited to the embodiments set forth herein.

Figure 1:
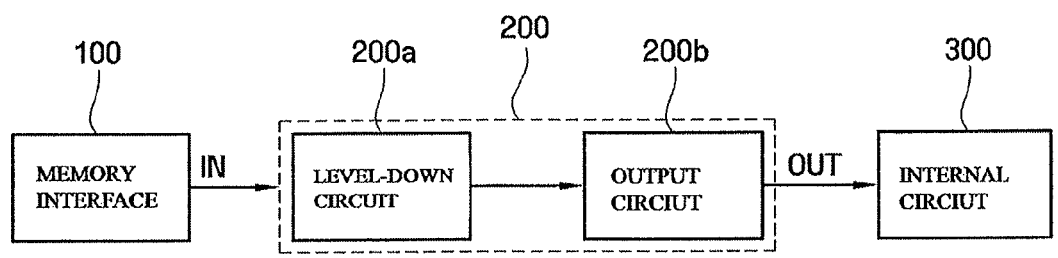
FIG. 1 is a block diagram of a semiconductor memory device including a level-down shifter circuit according to an exemplary embodiment.

Hereinafter, the configuration and operation of a semiconductor memory device will be described in detail with reference to FIG. 1. FIG. 1 is a block diagram of a semiconductor memory device including a level-down shifter circuit according to an exemplary embodiment.

Referring to FIG. 1, the semiconductor memory device including a level-down shifter 200 according to the current exemplary embodiment includes a memory interface 100, the level-down shifter 200, and an internal circuit 300.

The memory interface 100 functions as a data bus that transmits digital signals between a processor and the internal circuit 300 of the semiconductor memory device. For stable data transmission, a voltage level of the memory interface 100 may be higher than that of the internal circuit 300. For example, a voltage of the memory interface 100 may swing from 1.8 V to 0.72 V.

The level-down shifter 200 includes a level-down circuit 200a and an output circuit 200b. The level-down circuit 200a receives an input signal IN from the memory interface 100 and converts the input signal IN into a voltage signal that varies within a range from a voltage greater than a ground voltage GND to a voltage smaller than an internal power supply voltage VDD. The voltage signal output from the level-down circuit 200a is provided to the output circuit 200b. The level-down circuit 200a has a self-biased feedback structure. Since a bias current is controlled by the self-biased feedback structure, the distortion of a duty cycle can be minimized despite process-voltage-temperature (PVT) variations.

The output circuit 200b receives the voltage signal from the level-down shifter 200 and transmits an output signal OUT, which varies within a range from a voltage closer to the ground voltage GND to a voltage closer to the internal power supply voltage VDD, to the internal circuit 300.

Figure 2:
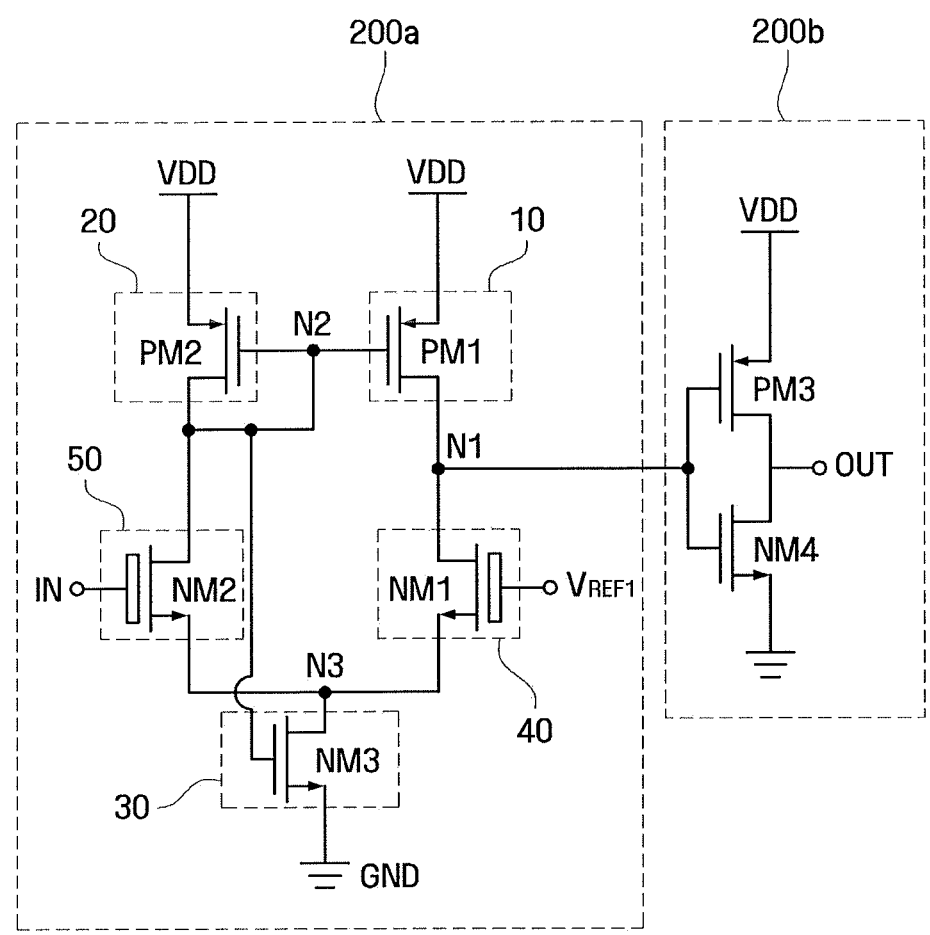
FIG. 2 is a circuit diagram of a level-down shifter according to an exemplary embodiment.

The structure and operation of a level-down shifter according to an exemplary embodiment will now be described in more detail. FIG. 2 is a circuit diagram of a level-down shifter according to an exemplary embodiment.

Referring to FIG. 2, the level-down shifter according to the current exemplary embodiment includes a level-down circuit 200a and an output circuit 200b. The level-down circuit 200a includes first and second load devices 10 and 20, a current source 30, and first and second input devices 40 and 50.

The first load device 10 is connected between a first voltage, e.g., an internal power supply voltage VDD, and a first node N1. The second load device 20 is connected between the first voltage, e.g., the internal power supply voltage VDD, and a second node N2.

In the current exemplary embodiment, the first and second load devices 10 and 20 may be connected in a current mirror. That is, the first and second load devices 10 and 20 may be first and second p-channel metal oxide semiconductor (PMOS) transistors PM1 and PM2 having respective gates connected to the second node N2. When the first and second PMOS transistors PM1 and PM2 are configured in a current mirror as shown in FIG. 1, a large output amplitude cannot be obtained from the second PMOS transistor PM2 since the second PMOS transistor PM2 is diode-connected and thus has a very low resistance value. Therefore, an output voltage can be obtained only from the first PMOS transistor PM1.

The first and second PMOS transistors PM1 and PM2 may be substantially the same size, but present embodiments are not limited thereto. Here, the size of a metal oxide semiconductor (MOS) transistor denotes a ratio of a width (W) of a channel region to a length (L) of the channel region, that is, W/L. In most cases, a minimum margin of photolithography process is used as the length of the channel region. Therefore, the width of the channel region is usually increased. In addition, the phrase "substantially the same size" means that the W/L ratios of the first and second PMOS transistors PM1 and PM2 are completely the same or that they are different only by a value corresponding to an error that often occurs during a process.

The current source 30 is connected between a second voltage, e.g., a ground voltage GND, and a third node N3. The current source 30 receives a voltage of the second node N2 and adjusts a voltage of the third node N3 and a bias current based on the received voltage. The current source 30 may be a third n-channel metal oxide semiconductor (NMOS) transistor NM3 having a gate connected to the second node N2.

The first input device 40 is connected between the first node N1 and the third node N3. The first input device 40 receives a reference voltage signal Vref and adjusts a voltage level of the first node N1 based on the reference voltage signal Vref. The first input device 40 may be a first NMOS transistor NM1 having a gate to which the reference voltage signal Vref is input. Here, the reference voltage signal Vref may be a constant voltage whose level always remains the same. The reference voltage signal Vref may be provided from an external source outside an integrated circuit apparatus through a predetermined input pin or may be generated within the integrated circuit apparatus. For example, a voltage of the reference voltage signal Vref may have a median value between a high-level voltage of the input signal IN and a low-level voltage of the input signal IN and may be 0.7 times the high-level voltage of the input signal IN.

The second input device 50 is connected between the second node N2 and the third node N3. The second input device 50 receives the input signal IN and adjusts a voltage level of the second node N2 based on the input signal IN. The second input device 50 may be a second NMOS transistor NM2 having a gate to which the input signal IN is input. Here, the input signal IN may be a data signal transmitted through the memory interface 100 and may vary between a high-level voltage of 1.8 V and a low-level voltage of 0.72 V.

The first and second NMOS transistors NM1 and NM2 may be substantially the same size. In addition, gate oxide films of the first and second NMOS transistors NM1 and NM2 may have substantially equal thicknesses and may be thicker than those of the first and second PMOS transistors PM1 and PM2 and the third NMOS transistor NM3. For example, the gate oxide films of the first and second PMOS transistors PM1 and PM2 and the third NMOS transistor NM3 may have a thickness of 0.13 μm, and the gate oxide films of the first and second NMOS transistors NM1 and NM2 may have a thickness of 0.35 μm.

The output circuit 200b is connected to the first node N1 and transmits an output signal OUT to the internal circuit 300. The output circuit 200b is a complementary metal oxide semiconductor (CMOS) inverter and may consist of a third PMOS transistor PM3 and a fourth NMOS transistor NM4. A source of the third PMOS transistor PM3 is connected to the first voltage, e.g., the internal power supply voltage VDD, and a drain of the third PMOS transistor PM3 is connected to a drain of the fourth NMOS transistor NM4. A source of the fourth NMOS transistor NM4 is connected to the second voltage, e.g., the ground voltage GND, and gates of the third PMOS transistor PM3 and the fourth NMOS transistor NM4 are connected to the first node N1.

A voltage level of the input signal IN may be higher than a voltage level of the first voltage, e.g., the internal power supply voltage VDD. Specifically, the high-level voltage of the input signal IN may be greater than the internal power supply voltage VDD. The high-level voltage of the input signal IN may be 1.8 V, and the voltage of the internal power supply voltage VDD may be 1.2 V.

The operation of the level-down shifter according to the current exemplary embodiment will now be described with reference to FIG. 2. For ease of description, it is assumed that the input signal IN swings from 0.72 V to 1.8 V and that the reference voltage signal Vref is fixed to 1.26 V. In addition, it is assumed that the internal power supply voltage VDD is 1.3 V and that the ground voltage GND is 0 V.

When the received input signal IN is at a low level, the first NMOS transistor NM1 is turned on, and the second NMOS transistor NM2 is turned off. Accordingly, the voltage level of the first node N1 becomes a low level, the third PMOS transistor PM3 connected to the first node N1 is turned on, and the fourth NMOS transistor NM4 connected to the first node N1 is turned off. Consequently, the output signal OUT becomes a high level close to the internal power supply voltage VDD.

When the received input signal IN is at a high level, the first NMOS transistor NM1 is turned off, and the second NMOS transistor NM2 is turned on. Accordingly, the voltage level of the first node N1 becomes a high level, the third PMOS transistor PM3 connected to the first node N1 is turned off, and the fourth NMOS transistor NM4 connected to the first node N1 is turned on. Consequently, the output signal OUT becomes a low level close to the ground voltage GND.

That is, when the input signal IN is at a high level, the output signal OUT becomes a low level. When the input signal IN is at a low level, the output signal OUT becomes a high level. Here, the input signal IN swings from 0.72 V to 1.8 V, while the output signal OUT swings from 0 V to 1.3 V. That is, the voltage level of the output signal OUT is reduced from that of the input signal IN.

Since the first and second NMOS transistors NM1 and NM2 having the thick gate oxide films are employed, an allowable margin of an input voltage is increased, thereby enabling stable leveling down of the input voltage. Specifically, to minimize and optimize the internal circuit (300), a minimum internal power supply voltage VDD may be determined based on allowable margins of transistors of the internal circuit (300). That is, the size of transistors of the internal circuit (300) and the internal power supply voltage VDD may be designed to a minimum size and voltage. On the other hand, the input signal IN transmitted from the memory interface 100 may have a higher voltage level than the internal power supply VDD used in the internal circuit 300 in order to prevent a loss in data transmission. To respond to the input signal IN having a high voltage level, the first and second NMOS transistors NM1 and NM2 having greater allowable margins may be used, and the other transistors may have a minimum size allowed in a process, thereby minimizing the area of the circuit.

The gate of the third NMOS transistor NM3 is connected to the second node N2. Since a voltage input to the gate of the third NMOS transistor NM3 changes according to PVT variations, the distortion of a duty cycle, which occurs during a level-down process, can be minimized. For example, when the voltage of the second node N2 becomes abnormally high, the voltage of the gate of the third NMOS transistor NM3 connected to the second node N2 increases, thereby increasing the bias current. Therefore, since the amount of bias current that flows through the second node N2 or the first node N1 should also increase, |Vgs| of the first and second PMOS transistors PM1 and PM2 should increase. Accordingly, the voltage of the second node N2 connected to the gates of the first and second PMOS transistors PM1 and PM2 may be reduced. That is, the third NMOS transistor NM3 having the gate connected to the second node N2 forms a self-biased feedback structure. The self-biased feedback structure negatively feeds back PVT variations, thereby reducing the distortion of the duty cycle.

Therefore, since transistors having thick gate oxide films are used in a differential input unit, an input signal having a high voltage level can be lowered to a low voltage level within a chip without using a level-down circuit. In addition, a self-biased feedback structure employed in the current exemplary embodiment controls a bias current according to PVT variations, thereby minimizing the distortion of a duty cycle.

Figure 3:
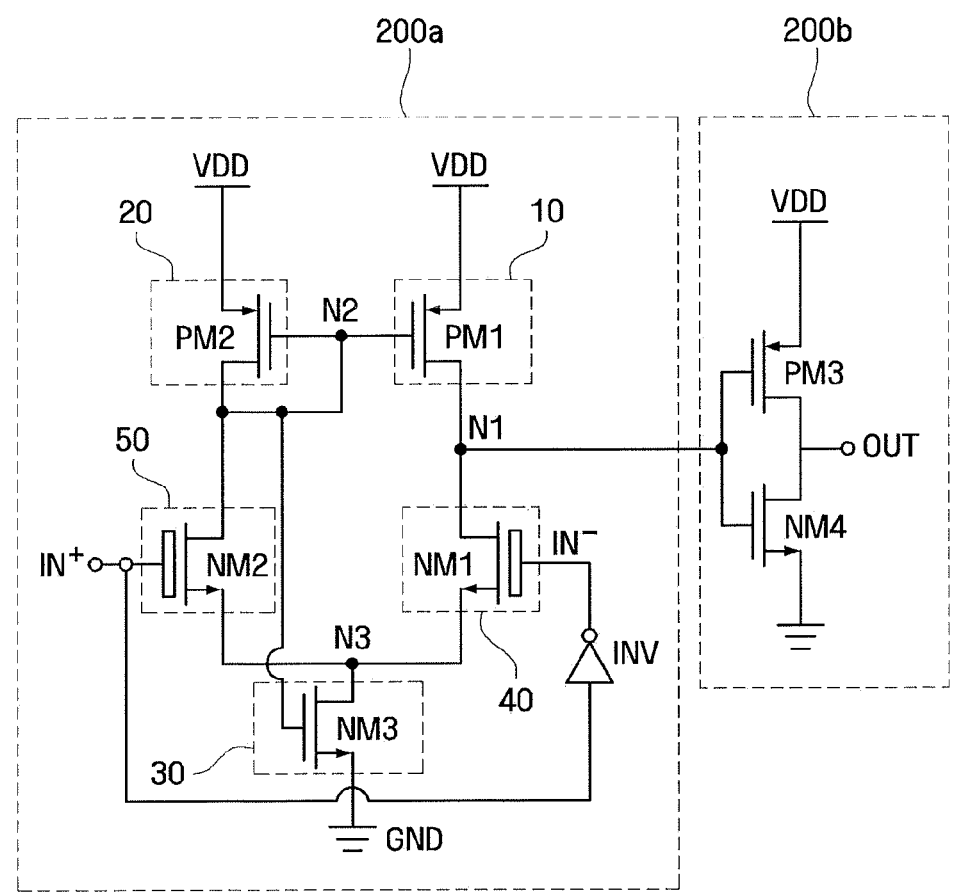
FIG. 3 is a circuit diagram of a level-down shifter according to another exemplary embodiment.

FIG. 3 is a circuit diagram of a level-down shifter according to another exemplary embodiment. Elements substantially identical to those of FIG. 2 are indicated by like reference numerals, and thus their detailed description will be omitted.

Referring to FIG. 3, the level-down shifter according to the current exemplary embodiment is different from the level-down shifter according to the previous embodiment in that an inverted signal IN– of an input signal IN is input to a first input device. Therefore, an inverter INV connected between the input signal IN and the inverted signal IN– of the input signal IN may further be provided. Since a differential input signal is transmitted, whether first and second NMOS transistors are turned on and/or off is determined at a time when voltage levels of the input signal IN and the inverted signal IN– are inverted.

A delay occurs in an inverter INV1 of a third input device 60 in order to invert the input signal IN. However, this delay can be ignored since it is very short.

Present embodiments will be described in further detail with reference to the following specific examples. Features not described here can be readily inferred by those of ordinary skill in the art, and thus a detailed description thereof will be omitted.

Experimental Example

A circuit structured as shown in FIG. 2 was formed and simulated using HSPICE by varying processing speed, voltage, and temperature. Specifically, a circuit structured as shown in FIG. 2 was simulated with 2 Gbps, 27-1 pseudorandom binary sequence (PRBS) data to measure the distortion of a duty cycle.

Comparative Example

Figure 4:
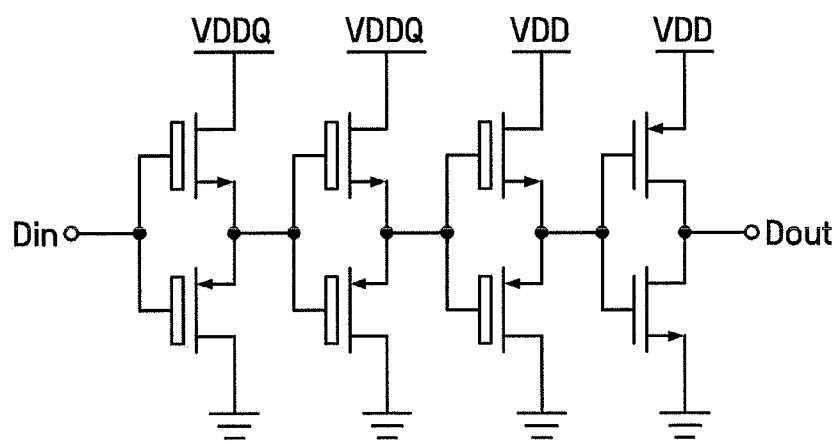
FIG. 4 is a circuit diagram of a level-down shifter according to a comparative example.

FIG. 4 is a circuit diagram of a level-down shifter. In the level-down shifter of FIG. 4, transistors in the internal circuit can only be used at a low voltage level. Therefore, when data having a high voltage level needs to be transmitted, complementary metal oxide semiconductor (CMOS) inverters having different allowable voltage levels are sequentially connected to reduce the data voltage level. However, in a CMOS inverter, when the PMOS transistor is two or three times larger than the NMOS transistor, a duty cycle of a p-channel metal oxide semiconductor (PMOS) transistor matches that of an n-channel metal oxide semiconductor (NMOS) transistor. In the level-down shifter of FIG. 4, since a |Vgs| voltage of a PMOS transistor is smaller than a Vgs voltage of an NMOS transistor, the PMOS transistor should be approximately five times larger than the NMOS transistor, so that duty cycles of the PMOS and NMOS transistors match.

The level-down shifter illustrated in FIG. 4 was simulated with 2 Gbps, 27-1 PRBS data to measure the distortion of a duty cycle.

The simulation results of the experimental and comparative examples are illustrated in FIGS. 5 through 11. In the experimental example and the comparative example, the x-axis indicates time (psec), and the y-axis indicates output voltage (V). The experimental example and the comparative example were simulated with 2 Gbps, 27-1 PRBS data under a total of seven conditions as shown in Table 1 below

TABLE 1

| No. | Simulation Type | NMOS | PMOS | Temperature | Power |
|---|---|---|---|---|---|
| 1 | Normal condition | Normal | Normal | 25° C. | Normal |
| 2 | Low-speed condition | Low speed | Low speed | 100° C. | −10% |
| 3 | High-speed condition | High speed | High speed | 0° C. | +10% |
| 4 | High-speed/ low-speed condition 1 | High speed | Low speed | 0° C. | +10% |
| 5 | Low-speed/ low-speed condition 1 | Low speed | High speed | 0° C. | +10% |
| 6 | High-speed/ low-speed condition 2 | High speed | Low speed | 100° C. | −10% |
| 7 | Low-speed/ high-speed condition 2 | Low speed | High speed | 100° C. | −10% |

FIG. 5 illustrates the results of simulations performed under a normal condition where normal NMOS and PMOS transistors and normal power required in a process are used and where temperature is 25° C.

Referring to the experimental example of FIG. 5, a rising time of an output signal at a rising edge thereof matches a falling time of the output signal at a falling edge thereof. Accordingly, the rising and falling edges of the output voltage intersect at approximately 0.65 V which corresponds to a median value of a swing voltage.

On the other hand, referring to the comparative example of FIG. 5, a rising time of an output signal at a rising edge is shorter than a falling time of the output signal at a falling edge. Accordingly, the rising and falling edges of the output signal intersect at approximately 0.9 V, and a gap of approximately 5.5 psec is generated at approximately 0.65 V which corresponds to a median value of a swing voltage.

FIG. 6 illustrates the results of simulations performed under a low-speed condition where low-speed NMOS transistors, low-speed PMOS transistors and 10% less power than normal are used and where temperature is 100° C.

Referring to the experimental example of FIG. 6, a rising time of an output signal at a rising edge thereof matches a falling time of the output signal at a falling edge thereof. Accordingly, the rising and falling edges of the output voltage intersect at approximately 0.6 V which corresponds to a median value of a swing voltage.

On the other hand, referring to the comparative example of FIG. 6, a rising time of an output signal at a rising edge is longer than a falling time of the output signal at a falling edge. Accordingly, the rising and falling edges of the output signal intersect at approximately 0.2 V, and a gap of approximately 12.5 psec is generated at approximately 0.6 V which corresponds to a median value of a swing voltage.

FIG. 7 illustrates the results of simulations performed under a high-speed condition where high-speed NMOS transistors, high-speed PMOS transistors and 10% more power than normal are used and where temperature is 0° C.

Referring to the experimental example of FIG. 7, a rising time of an output signal at a rising edge thereof matches a falling time of the output signal at a falling edge thereof. Accordingly, the rising and falling edges of the output voltage intersect at approximately 0.7 V which corresponds to a median value of a swing voltage.

On the other hand, referring to the comparative example of FIG. 7, a rising time of an output signal at a rising edge is shorter than a falling time of the output signal at a falling edge. Accordingly, the rising and falling edges of the output signal intersect at approximately 1.3 V, and a gap of approximately 13.5 psec is generated at approximately 0.7 V which corresponds to a median value of a swing voltage.

FIG. 8 illustrates the results of simulations performed under high-speed/low-speed condition 1 where high-speed NMOS transistors, low-speed PMOS transistors and 10% more power than normal are used and where temperature is 0° C.

Referring to the experimental example of FIG. 8, a rising time of an output signal at a rising edge thereof matches a falling time of the output signal at a falling edge thereof. Accordingly, the rising and falling edges of the output voltage intersect at approximately 0.7 V which corresponds to a median value of a swing voltage.

On the other hand, referring to the comparative example of FIG. 8, a rising time of an output signal at a rising edge is shorter than a falling time of the output signal at a falling edge. Accordingly, the rising and falling edges of the output signal intersect at approximately 1.3 V, and a gap of approximately 6 psec is generated at approximately 0.7 V which corresponds to a median value of a swing voltage.

FIG. 9 illustrates the results of simulations performed under low-speed/high-speed condition 1 where low-speed NMOS transistors, high-speed PMOS transistors and 10% more power than normal are used and where temperature is 0° C.

Referring to the experimental example of FIG. 9, a rising time of an output signal at a rising edge thereof matches a falling time of the output signal at a falling edge thereof. Accordingly, the rising and falling edges of the output voltage intersect at approximately 0.7 V which corresponds to a median value of a swing voltage.

On the other hand, referring to the comparative example of FIG. 9, a rising time of an output signal at a rising edge is shorter than a falling time of the output signal at a falling edge. Accordingly, the rising and falling edges of the output signal intersect at approximately 1.3 V, and a gap of approximately 25.5 psec is generated at approximately 0.7 V which corresponds to a median value of a swing voltage.

FIG. 10 illustrates the results of simulations performed under high-speed/low-speed condition 2 where high-speed NMOS transistors, low-speed PMOS transistors and 10% less power than normal are used and where temperature is 100° C.

Referring to the experimental example of FIG. 10, a rising time of an output signal at a rising edge thereof matches a falling time of the output signal at a falling edge thereof. Accordingly, the rising and falling edges of the output voltage intersect at approximately 0.6 V which corresponds to a median value of a swing voltage.

On the other hand, referring to the comparative example of FIG. 10, a rising time of an output signal at a rising edge is longer than a falling time of the output signal at a falling edge. Accordingly, the rising and falling edges of the output signal intersect at approximately 0.3 V, and a gap of approximately 39.5 psec is generated at approximately 0.6 V which corresponds to a median value of a swing voltage.

FIG. 11 illustrates the results of simulations performed under low-speed/high-speed condition 2 where low-speed NMOS transistors, high-speed PMOS transistors and 10% less power than normal are used and where temperature is 100° C.

Referring to the experimental example of FIG. 11, a rising time of an output signal at a rising edge thereof matches a falling time of the output signal at a falling edge thereof. Accordingly, the rising and falling edges of the output voltage intersect at approximately 0.6 V which corresponds to a median value of a swing voltage.

On the other hand, referring to the comparative example of FIG. 11, a rising time of an output signal at a rising edge is longer than a falling time of the output signal at a falling edge. Accordingly, the rising and falling edges of the output signal intersect at approximately 0 V, and a gap of approximately 10.15 psec is generated at approximately 0.6 V which corresponds to a median value of a swing voltage.

The results of comparing duty cycles and the level-down shifter circuit of FIG. 4 according to PVT variations are summarized in Table 2. Referring to Table 2, the level-down shifter circuit of FIG. 4 in the comparative example has an error of −0.5% to 7.9%, whereas the experimental example has an error of ±0.3% which is more than approximately 15 times lower than the error of the conventional circuit.

TABLE 2

| No | Simulation Type | Comparative Example | Experimental Example |
|---|---|---|---|
| 1 | Normal condition | 51.1 | 50 |
| 2 | Low-speed condition | 47.5 | 49.7 |
| 3 | High-speed condition | 52.7 | 49.9 |
| 4 | High-speed/low-speed condition 1 | 48.4 | 50.3 |
| 5 | Low-speed/high-speed condition 1 | 44.9 | 50.3 |
| 6 | High-speed/low-speed condition 2 | 57.9 | 50.0 |
| 7 | Low-speed/high-speed condition 2 | 52.33 | 50.2 |

Exemplary embodiments provide at least one of the following advantages.

A level-down shifter according to exemplary embodiments includes a current source having a self-biased feedback structure. Therefore, the distortion of a duty cycle due to PVT variations can be minimized.

In a level-down shifter according to exemplary embodiments, metal-oxide semiconductor field-effect transistors (MOSFETs) having thick gate oxide films are employed in an input unit. Since the MOSFETs directly convert a signal having a high voltage level into a signal having a low voltage level, the area of the level-down shifter circuit can be minimized.

By way of summation and review, a semiconductor memory device may include a level-down shifter to convert a signal of an external logic level into a signal of an internal logic level. In the comparative example, sensing a large voltage level difference, the area of the level-down shifter circuit increases.

Also, a distortion of a duty cycle occurs during process-voltage-temperature (PVT) variations. Data loaded into a double data rate (DDR) memory has both rising and falling edges of a clock. Therefore, distortion of the duty cycle is an important design consideration, since it further reduces a sampling margin, particularly in the DDR memory.

In contrast, present embodiments may provide a level-down shifter circuit having reduced distortion of a duty cycle in case of process-voltage-temperature (PVT) variations.

Exemplarily embodiments have been disclosed herein, and although specific terms are employed, they are used and are to be interpreted in a generic and descriptive sense only and not for purpose of limitation.

What is claimed is:

1. A level-down shifter, comprising:
a first load device connected between a first voltage source and a first node;
a second load device connected between the first voltage source and a second node;
a first input device connected between the first node and a third node, receiving a reference voltage signal, and adjusting a first node voltage of the first node based on the reference voltage signal;
a second input device connected between the second node and the third node, receiving an input signal, and adjusting a second node voltage of the second node based on the input signal; and
a current source connected between a second voltage source and the third node, receiving the second node voltage of the second node, and adjusting a third node voltage of the third node and a bias current based on the second node voltage of the second node, wherein:
the first load device includes a first transistor,
the second load device includes a second transistor,
the first input device includes a third transistor,
the second input device includes a fourth transistor,
gate oxide thicknesses of the third and fourth transistors are larger than gate oxide thicknesses of the first and second transistors, and
a voltage difference between the input signal and the second voltage source is higher than a voltage difference between the first voltage source and the second voltage source, and wherein
the first input device and the second input device are connected to the current source and are not connected to another current source.

2. The shifter as claimed in claim 1, wherein the third transistor of the first input device is a first n-channel metal oxide semiconductor (NMOS) transistor having a gate to which the reference voltage signal is input.

3. The shifter as claimed in claim 1, wherein the fourth transistor of the second input device is a second NMOS transistor having a gate to which the input signal is input.

4. The shifter as claimed in claim 3, wherein the third transistor of the first input device is a first NMOS transistor having a gate to which the reference voltage signal is input, and the first and second NMOS transistors are substantially of a same size.

5. The shifter as claimed in claim 1, wherein the first and second transistors of the first and second load devices are first and second p-channel metal oxide semiconductor (PMOS) transistors having respective gates connected to the second node.

6. The shifter as claimed in claim 5, wherein the first and second PMOS transistors are of substantially a same size.

7. The shifter as claimed in claim 1, wherein the current source is a third NMOS transistor having a gate connected to the second node.

8. The shifter as claimed in claim 1, further comprising an output circuit connected to the first node.

9. The shifter as claimed in claim 8, wherein the output circuit is a complementary metal oxide semiconductor (CMOS) inverter connected between the first voltage source and the second voltage source.

10. The shifter as claimed in claim 1, wherein gate oxide thicknesses of the third and fourth transistors are substantially the same.

11. The shifter as claimed in claim 1, wherein the first and second transistors are PMOS transistors and the third and fourth transistors are NMOS transistors.

12. The shifter as claimed in claim 1, wherein the voltage level of the input signal is higher than that of the second voltage source.

13. The shifter as claimed in claim 1, wherein the reference voltage signal received by the first input device corresponds to an inverted state of the input signal received by second input device.

14. The shifter as claimed in claim 1, wherein:
the input signal varies within a first voltage range, and
the reference voltage signal is a fixed voltage within the first voltage range.

15. The shifter as claimed in claim 1, wherein the gate oxide films of the third and fourth transistors is more than twice the thicknesses of the gate oxide films of the first and second transistors.

16. The shifter as claimed in claim 1, wherein:
the first node voltage corresponds to an output signal;
a duty cycle of the output signal is based on voltage changes of the input signal,
a midpoint of a rising edge of the output signal substantially corresponds to a midpoint of the falling edge of the output signal within the duty cycle, the midpoints of the rising and falling edges substantially coincident with a midpoint of a voltage swing of the output signal.

17. The shifter as claimed in claim 1, wherein:
the first node voltage corresponds to an output signal having a duty cycle;
the duty cycle is based on voltage changes of the input signal, and
a rising time of the output signal is substantially equal to a falling time of the output signal within the duty cycle.

18. The shifter as claimed in claim 1, wherein:
the first node voltage corresponds to an output signal having a duty cycle;
the duty cycle is based on voltage changes of the input signal, and
the duty cycle varies with an error that is less than 1% under different operating conditions.

19. The shifter as claimed in claim 1, wherein:
a voltage difference between the reference voltage and the second voltage source is higher than a voltage difference between the first voltage source and the second voltage source.

20. A level-down shifter, comprising:
a first PMOS transistor connected between a first voltage source and a first node and having a gate connected to a second node;
a second PMOS transistor connected between the first voltage source and the second node and having a gate connected to the second node;
a first NMOS transistor connected between the first node and a third node and adjusting a first node voltage of the first node when turned on by a reference voltage signal;
a second NMOS transistor connected between the second node and the third node and adjusting a second node voltage of the second node when turned on by an input signal; and
a current source including a third NMOS transistor connected between the third node and a second voltage source, receiving the second node voltage of the second node, and adjusting a third node voltage of the third node and a bias current based on the second node voltage of the second node, wherein a voltage difference between the input signal and the second voltage source is higher than a voltage difference between the first voltage source and the second voltage source, wherein
the first and second NMOS transistors are connected to the current source and are not connected to another current source, and wherein gate oxide films of the first and second NMOS transistors are thicker than gate oxide films of the first and second PMOS transistors.

21. The shifter as claimed in claim 20, wherein the first PMOS transistor, the second PMOS transistor, and the third NMOS transistor are of substantially a same size.

22. The shifter as claimed in claim 20, wherein the gate oxide films of the first and second NMOS transistors are thicker than a gate oxide film of the third NMOS transistor.

23. The shifter as claimed in claim 22, wherein the gate oxide films of the first and second NMOS transistors have a thickness of 0.35 μm, and the gate oxide films of the first PMOS transistor, the second PMOS transistor, and the third NMOS transistor have a thickness of 0.13 μm.

24. The shifter as claimed in claim 20, further comprising an output circuit connected to the first node.

25. The shifter as claimed in claim 24, wherein the output circuit is a CMOS inverter connected between the first voltage source and the second voltage source.

26. The shifter as claimed in claim 20, wherein:
a voltage difference between the reference voltage and the second voltage source is higher than a voltage difference between the first voltage source and the second voltage source.

* * * * *